United States Patent
Lo et al.

(10) Patent No.: US 11,381,241 B2
(45) Date of Patent: Jul. 5, 2022

(54) HIGH-PERFORMANCE TABLE-BASED STATE MACHINE

(71) Applicant: Microsoft Technology Licensing, LLC, Redmond, WA (US)

(72) Inventors: Daniel Lo, Bothell, WA (US); Blake D. Pelton, Redmond, MA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/178,017

(22) Filed: Feb. 17, 2021

(65) Prior Publication Data

US 2022/0085815 A1 Mar. 17, 2022

Related U.S. Application Data

(60) Provisional application No. 63/078,737, filed on Sep. 15, 2020.

(51) Int. Cl.
*H03K 19/094* (2006.01)
*H03K 19/096* (2006.01)
*H03K 19/17728* (2020.01)
*H03K 19/173* (2006.01)

(52) U.S. Cl.
CPC ..... *H03K 19/09425* (2013.01); *H03K 19/096* (2013.01); *H03K 19/1737* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 5,394,557 A | 2/1995 | Ellis | |
| 8,766,666 B2 * | 7/2014 | Dlugosch | G06F 9/544 |
| | | | 326/46 |
| 10,289,093 B1 * | 5/2019 | Lysaght | G05B 19/0426 |
| 2005/0035784 A1 | 2/2005 | Gould et al. | |
| 2011/0307433 A1 | 12/2011 | Dlugosch | |
| 2012/0017066 A1 * | 1/2012 | Vorbach | G06F 9/3885 |
| | | | 712/11 |

OTHER PUBLICATIONS

"International Search Report and Written Opinion Issued in PCT Application No. PCT/US21/034686", dated Sep. 2, 2021, 12 Pages.

* cited by examiner

*Primary Examiner* — Jany Richardson
(74) *Attorney, Agent, or Firm* — Fiala & Weaver P.L.L.C.

(57) ABSTRACT

A table-based state machine is improved by reducing critical dependence path. In one aspect, all current states for a given input are read from a state table circuit, and the next state and output are then selected therefrom by an output multiplexer based on the current state, removing dependence on the current state from the table read, and allowing the read(s) to be pipelined. In a further aspect, multiple input units are configured to operate on multiple inputs in parallel, with each input unit propagating its state table circuit for its current input to the next downstream input unit. Each downstream input unit is configured to use the propagated state table circuit to provide the state table circuit reads to the proper output multiplexer input. The number of possible output states for a given input may be dynamically reduced, reducing the size of the output multiplexer selecting the next state.

20 Claims, 8 Drawing Sheets

HIGH-PERFORMANCE TABLE-BASED STATE MACHINE

CROSS-REFERENCE TO RELATED APPLICATIONS

This application claims priority to U.S. Provisional Patent Application Ser. No. 63/078,737, filed Sep. 15, 2020, titled "High-Performance Table-Based State Machine," the entirety of which is incorporated by reference herein.

BACKGROUND

The performance of state machines is typically related to the dependence of each input on the previous state. For table-based state machines, this performance at least in part depends on a table lookup for each iteration.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Methods and systems are described herein that improve the performance of a table-based state machine by reducing the critical dependence path. In one aspect, all possible current states for a given input are read from a state table circuit, and the correct next state and output are then selected from amongst these by an output multiplexer based on the current state, thereby removing any dependence on the current state from the table read and allowing the read(s) to be pipelined.

In a further aspect, multiple input units are configured to operate on multiple inputs in parallel, with each input unit propagating its state table circuit for its current input to the next downstream input unit. Each downstream input unit is configured to use the propagated state table circuit to provide the state table circuit reads to the proper output multiplexer input.

In an additional aspect, embodiments may dynamically reduce the number of possible output states for a given input thereby reducing the size of the output multiplexer needed to select the next state. A further extension dynamically reduces the number of states for a given input.

Further features and advantages, as well as the structure and operation of various examples, are described in detail below with reference to the accompanying drawings. It is noted that the ideas and techniques are not limited to the specific examples described herein. Such examples are presented herein for illustrative purposes only. Additional examples will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present application and, together with the description, further serve to explain the principles of the embodiments and to enable a person skilled in the pertinent art to make and use the embodiments.

The features and advantages of embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features of the present invention. The scope of the present invention is not limited to the disclosed embodiments. The disclosed embodiments merely exemplify the present invention, and modified versions of the disclosed embodiments are also encompassed by the present invention. Embodiments of the present invention are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

A state machine is a device that may be implemented in electrical circuitry and/or program code executing in a processor, which at any particular time can be in one of a set number of stable conditions depending on its previous condition and on the present values of its inputs. The performance of state machines is typically related to the dependence of each input on the previous state. For table-based state machines, this performance at least in part depends on a table lookup for each iteration. This dependence makes it difficult to parallelize across inputs.

Embodiments disclosed herein provide a high-performance table-based state machine that enables extensive pipelining to hide latencies, and permit high clock frequency, and thus overcomes the deficiencies described above. Such embodiments may be implemented in various ways. In this section, we present an overview of a table-based state machine as depicted in FIG. 1.

Figure 1:
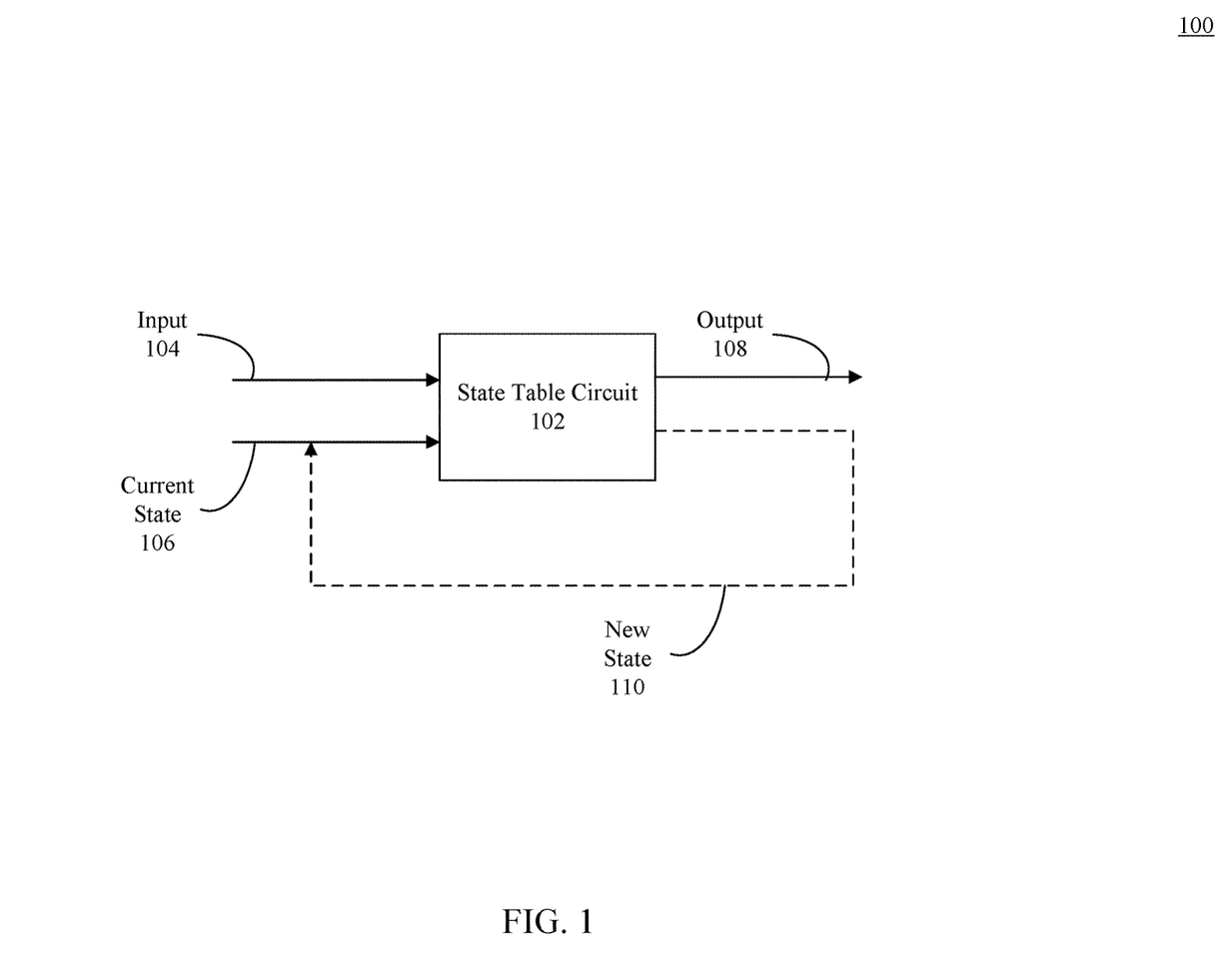
FIG. 1 depicts an example table-based state machine, according to an embodiment.

FIG. 1 depicts an example table-based state machine 100, according to an embodiment. Table-based state machine 100 includes a state table circuit 102. State table circuit 102 may be implemented in hardware (e.g., an electrical circuit including transistors, logic gates, electrical components, etc.) and is configured to receive/accept an input 104 and a current state 106 (also referred to herein as "current operating state") as inputs. State table circuit 102 is configured to thereafter generate an output 108 and a new state 110 (also referred to herein as "new operating state"). A table-based state machine includes hardware that implements a programmable state machine by encoding state transitions and outputs through a lookup table. For example, consider the following example state transition table, State Transition Table A:

| State Transition Table A | | | |
|---|---|---|---|
| Input 104 | Current State 106 | Output 108 | New state 110 |
| 0 | 0 | 0 | 0 |
| 0 | 1 | 1 | 1 |
| 1 | 0 | 1 | 1 |
| 1 | 1 | 0 | 0 |

State table circuit 102 may be implemented in hardware in various different ways, as known in the art to persons skilled in the relevant art(s), to provide a lookup-table mechanism whereby upon being provided with input 104 and current state 106 as inputs, state table circuit 102 generates output 108 and new state 110 as outputs with the values of such outputs dictated by its state transition table (e.g., State Transition Table A). For example, state table circuit 102 may be implemented in the form of transistors, logic gates, an Application Specific Integrated Circuit (ASIC), a configurable circuit such as in a Field Programmable Gate Array (FPGA), a Complex Programmable Logic Device (CPLD), and/or fabricated directly on silicon or other semiconductor materials using photolithographic techniques as known in the relevant art(s). As such, state table circuit 102 may be implemented using microprogramming techniques as also known in the relevant art(s), and one or more state transition tables associated with state table circuit 102 may likewise include microprogramming instructions, microcodes, one or more addresses for in-memory microcode subroutines, and the like. Thus, state table circuit 102 is not merely an arrangement of data, but instead exposes lookup-table functionality whereby outputs and new states may be retrieved from a corresponding state transition table stored in memory. For example, and with reference to State Transition Table A shown herein above, when input 104 is 1 and current state 106 is 1 and are provided to state table circuit 102 as inputs, state table circuit 102 will provide 0 for output 108, and 0 for new state 110 as outputs.

The performance of table-based state machine 100 is limited in at least two aspects. First, each input is processed sequentially because the new state depends on the previous input. Second, the processing time of each iteration of the state machine (i.e., the "iteration interval") is bottlenecked by the relatively slow memory access required to look up an entry in the state table circuit, and to output new state 110. That is, no matter how fast the next input 104 is provided to the state machine, generation of the next output 108 is blocked until such time that new state 110 is generated and fed back to become current state 106. Moreover, an increase in the time it takes to calculate output 108 likewise need not affect iteration time because calculating output 108 may be performed in parallel with beginning to process the next input 104. From these facts, it may be appreciated that the iteration interval of table-based state machine 100 is governed by the amount of time required to lookup and output new state 110. Based on these observations, we now turn to description of embodiments that are configured to reduce the iteration interval by removing any dependence on the current state or previous inputs from the state table lookup.

Figure 2:
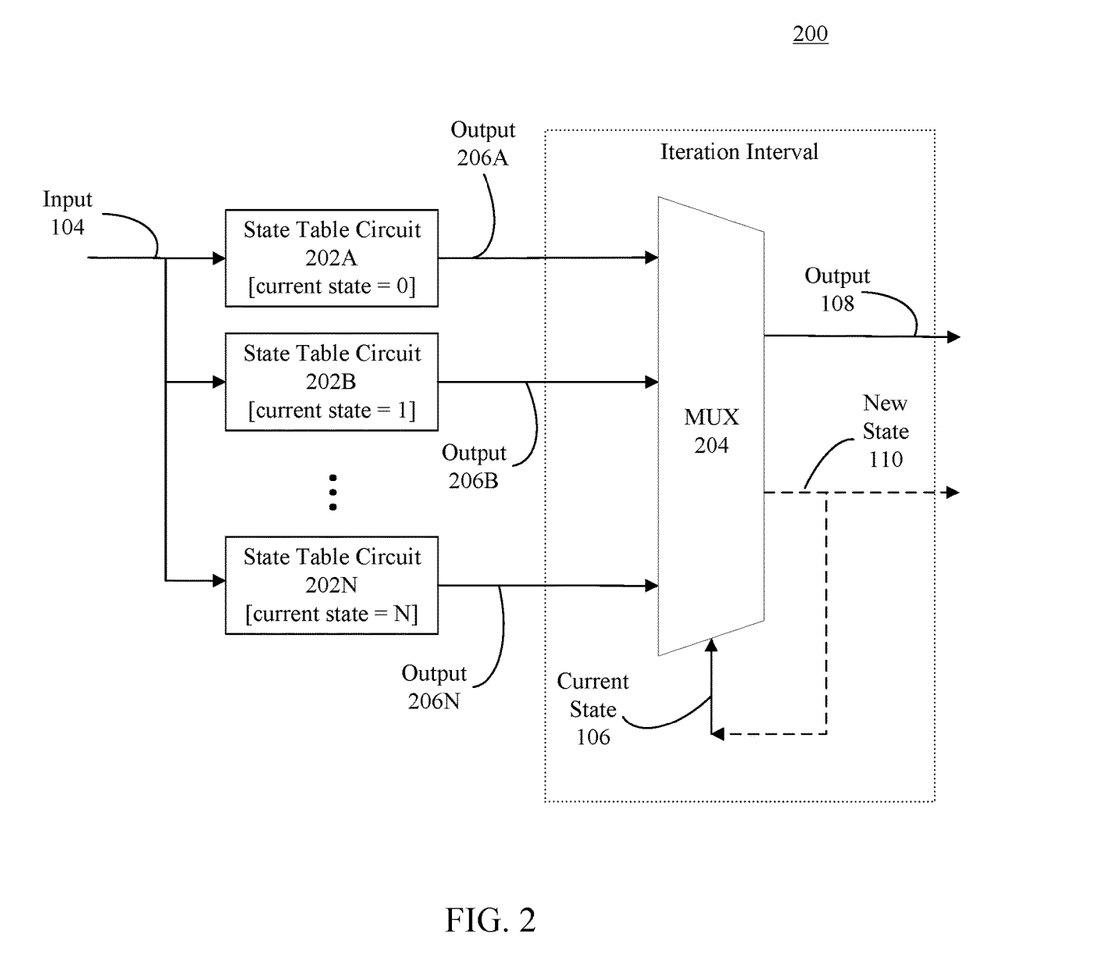
FIG. 2 depicts an example table-based state with a reduced iteration interval, according to an embodiment.

FIG. 2 depicts an example table-based state machine 200 with a reduced iteration interval, according to an embodiment. Table-based state machine 200 includes state table circuits 202A-202N and multiplexer ("MUX") 204. Each of state table circuits 202A-202N corresponds to a sub-table of a complete state transition table (such as, e.g., State Transition Table A shown above), wherein each of the sub-tables only includes information for one possible current state value. For example, state table circuit 202A includes state transition information that corresponds only to a current state of 0, state table circuit 202B includes state transition information that corresponds only to a current state of 1, and so forth. When a new value for input 104 is received and provided to each of state table circuits 202A-202N, each such table looks up and provides the state and output that corresponds to input 104 for each table as input to MUX 204. Note, for the sake of clarity in FIG. 2, the state and output from each of state table circuits 202A-202N is depicted as signals lines denoted as Outputs 206A-206N. It should be understood, however, that Outputs 206A-206N each include two independent signals (i.e., the state and output looked up in the table based on the fixed state corresponding to a particular state table circuit 202A-202N, and input 104). Moreover, although each of state table circuits 202A-202N is depicted as an independent circuit, it should be understood that embodiments are not so limited. For example, state table circuits 202A-202N may comprise one static random-access memory ("SRAM") that contains all the state transition tables for each of state table circuits 202A-202N.

As discussed above, MUX 204 receives outputs 206A-206N from the state table circuits 202A-202N, respectively, and is further configured to receive current state 106 as input. MUX 204 (or multiplexor 204) may be also referred to as a data selector, and is a device formed of electrical circuits (e.g., transistors, logic gates (such as AND gates, NAND gates, OR gates, XOR gates), etc.) that selects between several analog or digital input signals and forwards the selected input to a single output line. Moreover, although MUX 204 is depicted as an N-input MUX, due each of output 206A-206N including two signals, MUX 204 may also be configured as two independent N-input MUXES. One such MUX is used for selecting the correct output 206A-output 206N to route to output 108 based on current state 106, and the other MUX is used for selecting the correct input to route to new state 110. It should be noted that current state 106 will be updated to reflect new state 110 after every iteration.

Table-based state machine 200 as depicted in FIG. 2 removes the state table lookup/read from the dependence path inasmuch as each table lookup depends only on the current input, and the memory reads corresponding to the state table reads may be pipelined. Accordingly, the iteration interval for table-based state machine 200 depends only on the time it takes for MUX 204 to route the correct output and state from the state tables output 108 and new state 110, respectively. In embodiments, and depending on the size of the state machine (i.e., the number of possible states of the machine), operation of MUX 204 may be substantially faster than the table reads which, when combined with pipelining of such reads, enables embodiments to be switched at very high frequencies. Embodiments may implement further performance enhancement techniques as described herein below.

As discussed above, table-based state machine 100 suffers from a further drawback that each input is processed sequentially because the new state depends on the previous input. That is, because each input depends on the new state produced by the previous input, there is a dependence that prevents full parallelization. The embodiments described above reduce the dependence on knowing the current state for the most expensive part of the processing (i.e., the state table lookups), but do not necessarily achieve such state independence when used as a parallel input state machine.

Figure 3:
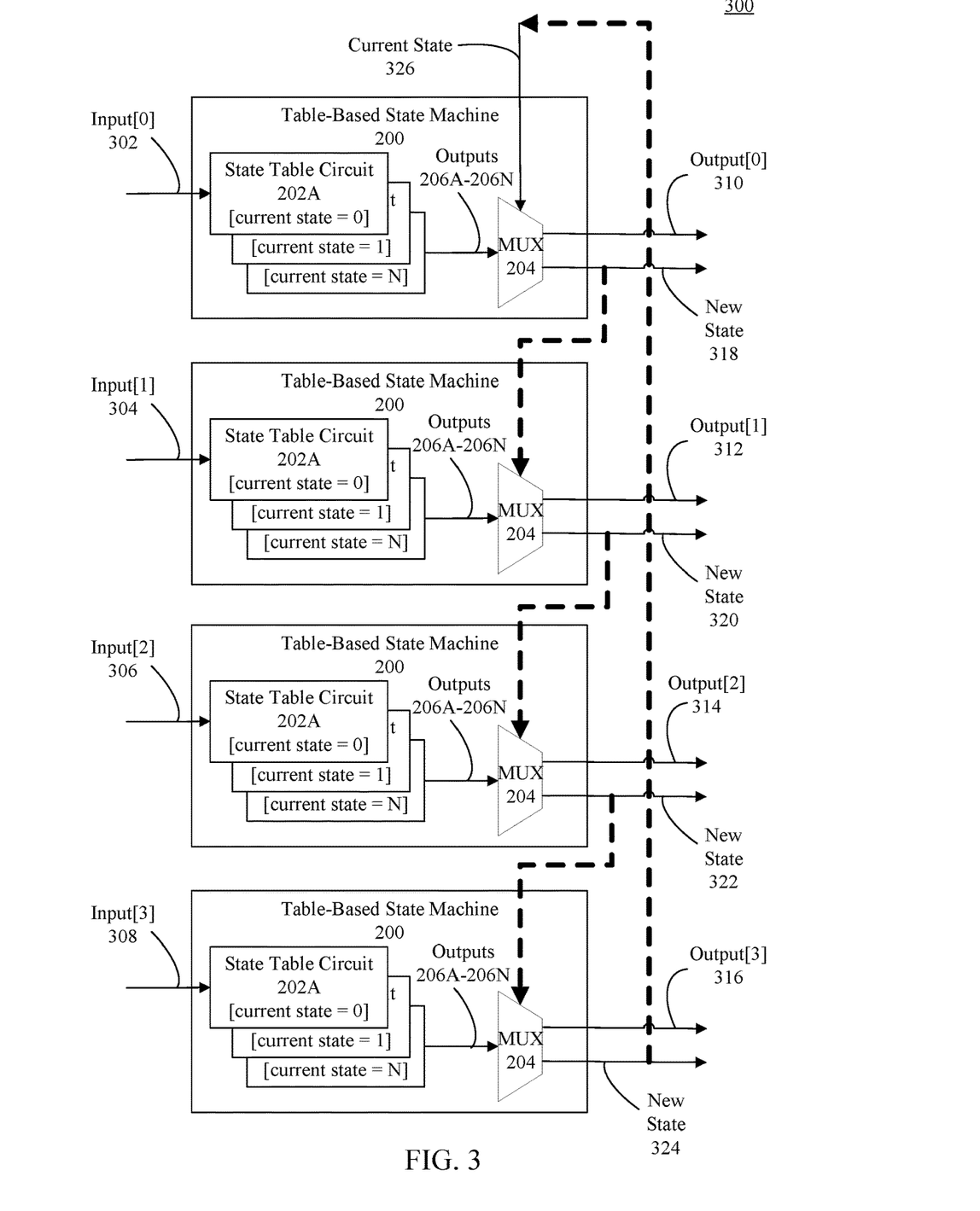
FIG. 3 depicts an example naïve implementation of a state machine configured to process inputs in parallel, according to an embodiment.

Consider, for example, FIG. 3 which depicts a naïve implementation of a state machine 300 configured to process inputs in parallel, according to an embodiment. State machine 300 includes four instances of table-based state machine 200, which each include respective instances of state table circuits 202A-202N. Each instance of table-based state machine 200 receives a corresponding one of Inputs 302-308 (denoted as Input[0]-Input[3], respectively) and generates a corresponding one of Outputs 310-316 (denoted as Output[0]-Output[3], respectively) and one of New States 318-324. Furthermore, each of New States 318-324 is fed forward to MUX 204 of the next instance of table-based state machine 200, with New State 324 ultimately being fed back and becoming Current State 326 which controls MUX 204 of the first instance of table-based state machine 200.

It is apparent in FIG. 3 that the naïve implementation of state machine 300 includes a state dependence chain as denoted by the bold dashed lines of New States 318-322 that are fed forward, as well as New State 324 that is fed back. That is, each of Output[1] 310, Output[2] 312 and Output[3] 314 is not generated until the New State of the prior stage is computed (e.g., each of New State 318-322, respectively) because such New States drive the corresponding MUXes 204 at each stage. Said another way, each of Outputs 310-316 do not become valid until after the delay imposed by the delay of its corresponding MUX 204, and thus obtaining the four outputs that comprise Outputs 310-316 takes a minimum of four delays of MUX 204. Unfortunately, such MUX operations cannot be pipelined because of this dependence. In embodiments, this dependence is removed to enable full pipelining that produces multiple outputs every clock.

Figure 4:
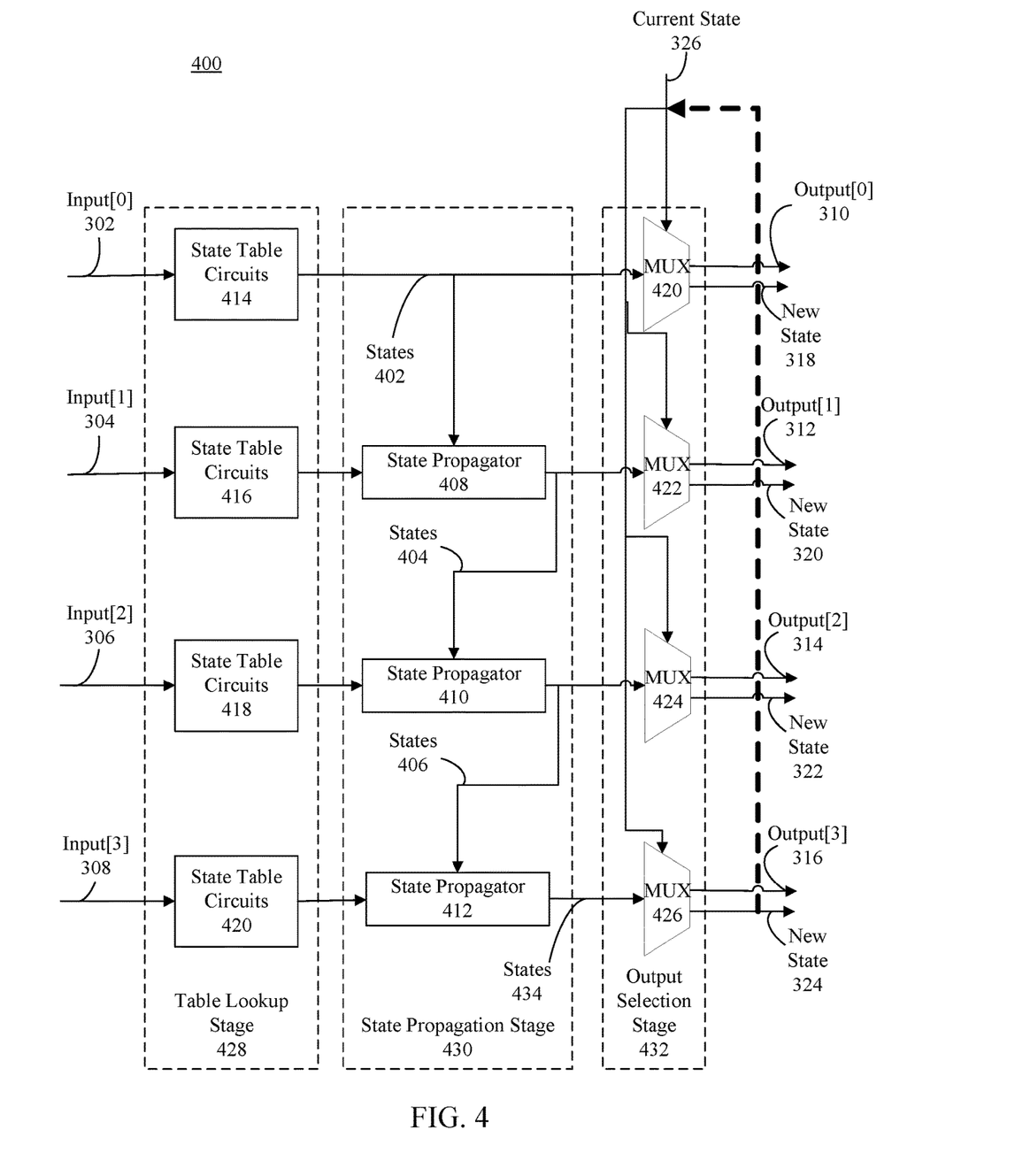
FIG. 4 depicts an example state machine configured to process inputs in parallel, and that improves the state machine of FIG. 3 by eliminating its state dependence, according to an embodiment.

For example, consider FIG. 4 which depicts an example state machine 400 configured to process inputs in parallel, and that improves state machine 300 of FIG. 3 by eliminating its state dependence, according to an embodiment. State machine 400 includes a table lookup stage 428, a state propagation stage 430, and an output selection stage 432. Table lookup stage 428 includes state table circuits 414-420. Stage propagation stage 430 includes state propagators 408-412, and output selection stage 432 includes MUXs 420-426. Each of state table circuits 414-420 corresponds to state table circuits 202A-202N of table-based state machine 200 as depicted in FIG. 3. Each of MUX 420-426 likewise corresponds to an instance of MUX 204 of table-based state machine 200 as depicted in FIG. 3. Other structural and operational embodiments will be apparent to persons skilled in the relevant art(s) based on the following discussion regarding state machine 400 of FIG. 4.

As shown in FIG. 4, state table circuits 414-420 each receive a corresponding one of inputs [0]-[3] 302-308, and generate corresponding output states. State table circuit 414 generates first output states 402 received by state propagator 408 and MUX 420. Each of state table circuit 416-420 generate respective output states received by a corresponding one of state propagators 408-412. State propagator 408 generates output states 404 received by MUX 422 and state propagator 410. State propagator 410 generates output states 406 received by MUX 424 and state propagator 412. State propagator 412 generates output states 434 received by MUX 426. MUX 420 receives output states 402 and current state 326 and generates output[0] 310 and new state 318. MUX 422 receives output states 404 and current state 326 and generates output[1] 312 and new state 320. MUX 424 receives output states 406 and current state 326 and generates output[2] 314 and new state 322. MUX 426 receives output states 434 and current state 326 and generates output[3] 316 and new state 324.

State machine 400 removes the state dependence inherent to state machine 300 as depicted in FIG. 3 by using the state transitions output from each set of state table circuits to determine the state transition table for later inputs. This process of determining later state transitions may be described as state tracing that may be understood by way of the following example.

Suppose input[0] 302 and input[1] 304 equal arbitrary values x and y, respectively, and that the state table lookup for those values and for each possible current state are shown as follows in Table B:

TABLE B

| current state | input[0] | input[1] |
|---|---|---|
| 0 | 1 | 2 |
| 1 | 3 | 3 |
| 2 | 2 | 0 |
| 3 | 0 | 1 |

Each table entry shown in Table B indicates the new state dictated by, for example, state table circuits 414 for the respective values of input[0] 302 and input[1] 304 for each possible current state. The idea behind state tracing is to determine what the current state corresponding to input[1] 304 will be (i.e., the new state generated in response to input[0]) given a particular current state corresponding to input[0] 302. One may find the new state for input[1] 302 if the current state to input[0] is 0 by tracing through Table B.

For example, suppose that the current state corresponding to input[0] is 0. The table above shows that for the current input at input[0] and a current state of 0, the new state will be 1. Next, given a current state of 1 304 (i.e., the new state resulting from input[0] 302 and its current state of 0) corresponding to input[1] 302, the table illustrates that the new state for input[1] is 3. The following table shows the tracing and the resulting state transition table for each possible current state given the particular values of input[0] 302 and input[1] 304.

| Traced State Transition Table C |||
|---|---|---|
| current state | input[0] | input[1] |
| 0 | 1 | 0 → 1 → 3 = 3 |
| 1 | 3 | 1 → 3 → 1 = 1 |
| 2 | 2 | 2 → 2 → 0 = 0 |
| 3 | 0 | 3 → 0 → 2 = 2 |

Table C above illustrates, for example, that for the current values in input[0] 302 and input[1] 304 and a current state of 2, the appropriate state corresponding to input[1] 304 is 0. More detailed operation of state machine 400 and state propagators 408 will now be described with reference to the above described state propagation table.

State machine 400 is very similar to state machine 300, but differs in a few key aspects. First, and with reference to FIGS. 2 and 3 and as described above, each of outputs 206A-206N includes both the possible states, and the possible outputs that will subsequently be selected by the corresponding MUX 204. For the sake of clarity, state machine 400 is depicting only the states being provided by a given set of state tables, and omits the outputs. It should be understood, however, that state table circuits 414-420 provide both states and outputs to MUXes 420-426 as described herein above with respect to table-based state machine 200. Second, state machine 400 includes state propagators 408-412, the operation of which will be described in further detail below. Third, each of MUXes 420-426 correspond to each MUX 204 depicted in FIG. 3, and are configured to be controlled by the *same* signal. That is, each of MUX 420-426 generate the output for their respective input at the same time according to current state 326. Thus, each of outputs 310-316 become valid at the same time (i.e., on the same clock cycle), and the aforementioned state dependency present in state machine 300 of FIG. 3 is removed. Removal the state dependency is accomplished through the use of state propagators 408-412. Although there is a dependence chain through the state propagation logic (e.g., a series of logic gates, flip-flops, transistors, etc.), the logic itself is not dependent on anything other than the current state and inputs and may thereby be fully pipelined.

For example, and as depicted in state machine 400 of FIG. 4, state table circuits 416-420 operate in parallel to simultaneously perform their respective table lookups in a pipeline stage denoted as table lookup stage 428. Likewise, state propagation as described below is performed in the pipeline stage denoted as state propagation stage 430. Finally, the final output and state that corresponds to each input are selected simultaneously by respective ones of MUXes 420-426 in output selection stage 432. Moreover, although the layout area and pipeline depth of state machine 400 are both increased, the additional time to fill the pipeline is negligible and thereafter state machine 400 may deliver multiple outputs per clock with a clock period that is less than the sum of the computation delays at each stage (i.e., the clock period need be only as long as required to complete the slowest stage).

Figure 5:
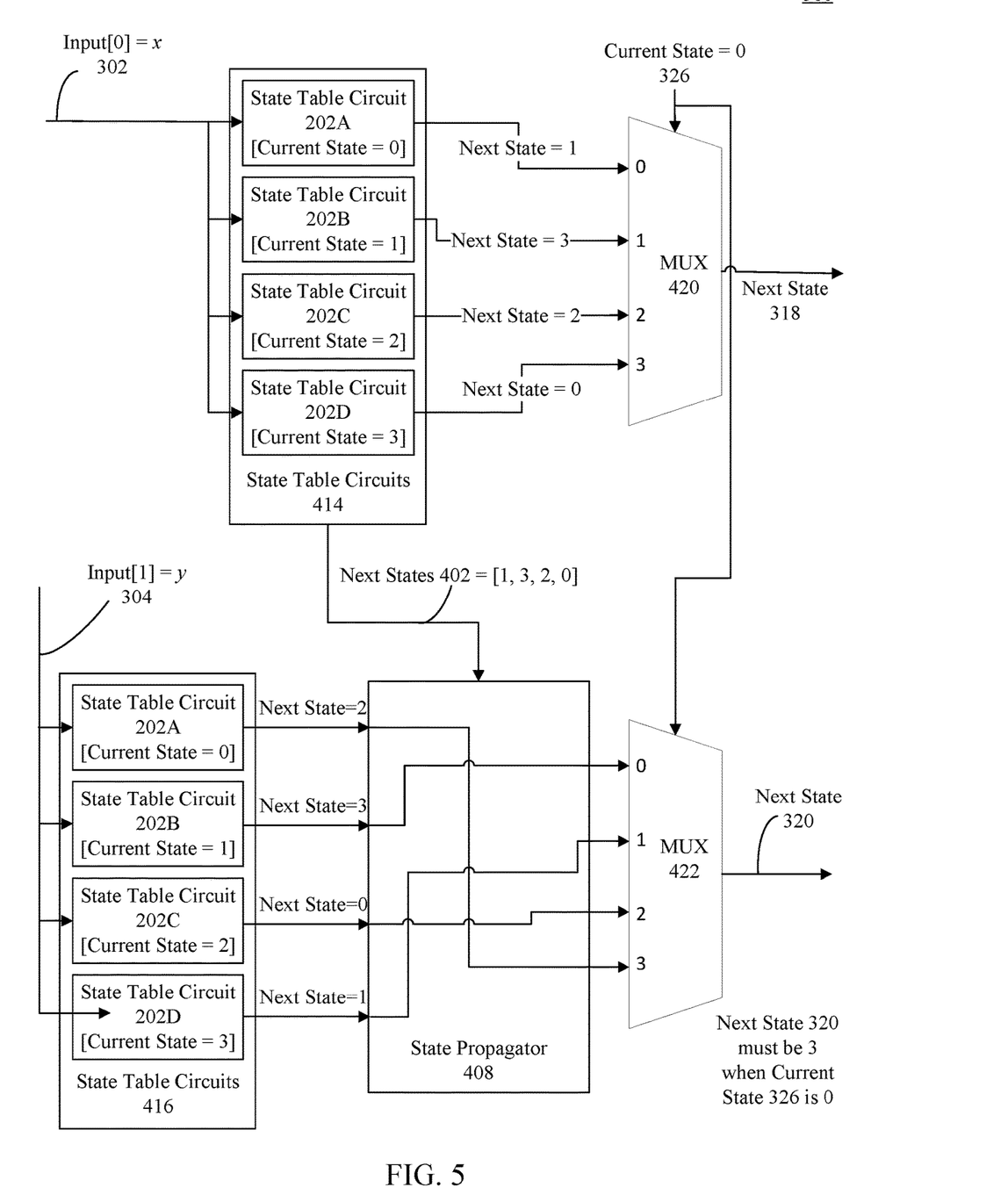
FIG. 5 depicts an excerpted portion of the state machine of FIG. 4 illustrating aspects of state propagator operation, according to an embodiment.

FIG. 5 depicts an excerpted portion 500 of state machine 400 of FIG. 4 illustrating aspects of state propagator 408 operation, according to an embodiment. Portion 500 includes state table circuits 414, state table circuits 416, MUX 420, MUX 422 and state propagator 408. State table circuits 414 and 416 as shown in FIG. 5 each include corresponding instances of state table circuits 202A-202D that correspond to each possible state (as further described above). Other structural and operational embodiments will be apparent to persons skilled in the relevant art(s) based on the following discussion regarding portion 500 of state machine 400 as illustrated in of FIG. 5.

FIG. 5 depicts state machine 400 in the context of the state tracing example, and Table B and Traced State Transition Table C corresponding thereto, as described above. In particular, for illustrative purposes, it is assumed that input[0] 302 and input[1] 304 have values x and y, respectively. Further, the states that are output from state table circuits 414 correspond to the values given input[0] 302=x for each of the possible states. Likewise, the states that are output from state table circuits 416 correspond to the values given input[1] 304=y for each of the possible states.

State propagator 408 is configured to re-map the state outputs of a given set of state table circuits to account for the traced states as reflected in the Traced State Transition Table C shown above. Suppose, for example, that current state 326=0. Traced State Transition Table C indicates that next state 320 is expected to have a value of 3. Thus, state propagator 408 is configured to route the correct Next State output from State table circuits 416 to input 0 of MUX 422 (input 0 is appropriate because current state 326=0). More specifically, and per the example state table circuits described herein above in the context of this example, state table circuits 416 indicate the state transitions indicated in Table B above, which dictates that for an value of y on input[1] 304, the next states are 2, 3, 0 and 1 for each of current states 0, 1, 2 and 3, respectively. Recalling that MUX 422 selects the signal line having a 3 on input 0 (because the current state is 0), state propagator 408 selects the next state corresponding to Current State=1 from state table circuits 416 because that next state equals 3.

Continuing with this example, suppose that current state 326 is 3. Per the Traced State Transition Table C shown above, next state 320 selected by MUX 422 is 2 when current state 326 is 3. Accordingly, state propagator 408 selects the next state corresponding to current state=0 in state table circuits 416 because that next state equals 2. By a similar process, one may see that in this example state propagator 408 routes the outputs corresponding to current states 2 and 3 of state table circuits 416 to inputs 2 and 1, respectively, of MUX 422.

With these aspects in mind, it may be appreciated that next states 402 as output from state table circuits 414 provides the exact mapping described herein above. That is, in this example, next states 402=[1, 3, 2, 0] may be used directly by state propagator 408 to route the correct next state to the correct input of MUX 422 because the values of next states 402 correspond one-to-one with inputs 0 through 3 on MUX 422, and such values dictate which of outputs 0 to 3 of state table circuits 416 should be chosen. That is, the state values of Next States 402 may be used to index the Next State outputs of State table circuits 416.

For example, the value of the first element of next states 402 (i.e., the value 1) corresponds to input 0 of MUX 422 and dictates that the output of current state 1 of state table circuits 416 be routed to that input by state propagator 408. By that same token, the second element of Next States 402 (i.e., the value 3) corresponds to input 1 of MUX 422 which will receive the value from the state table circuit for current state=3 from state table circuits 416, and so on. Put more simply, the values of next states 402 dictate to state propagator 408 which of next states output from state table circuits 416 to route to each of inputs 0 through 3 of MUX 422. State propagator 408 may accomplish such routing in a number of ways. For example, state propagator 408 may be implemented as a crossbar switch, or with MUXes as depicted in FIG. 6 as will now be described.

Figure 6:
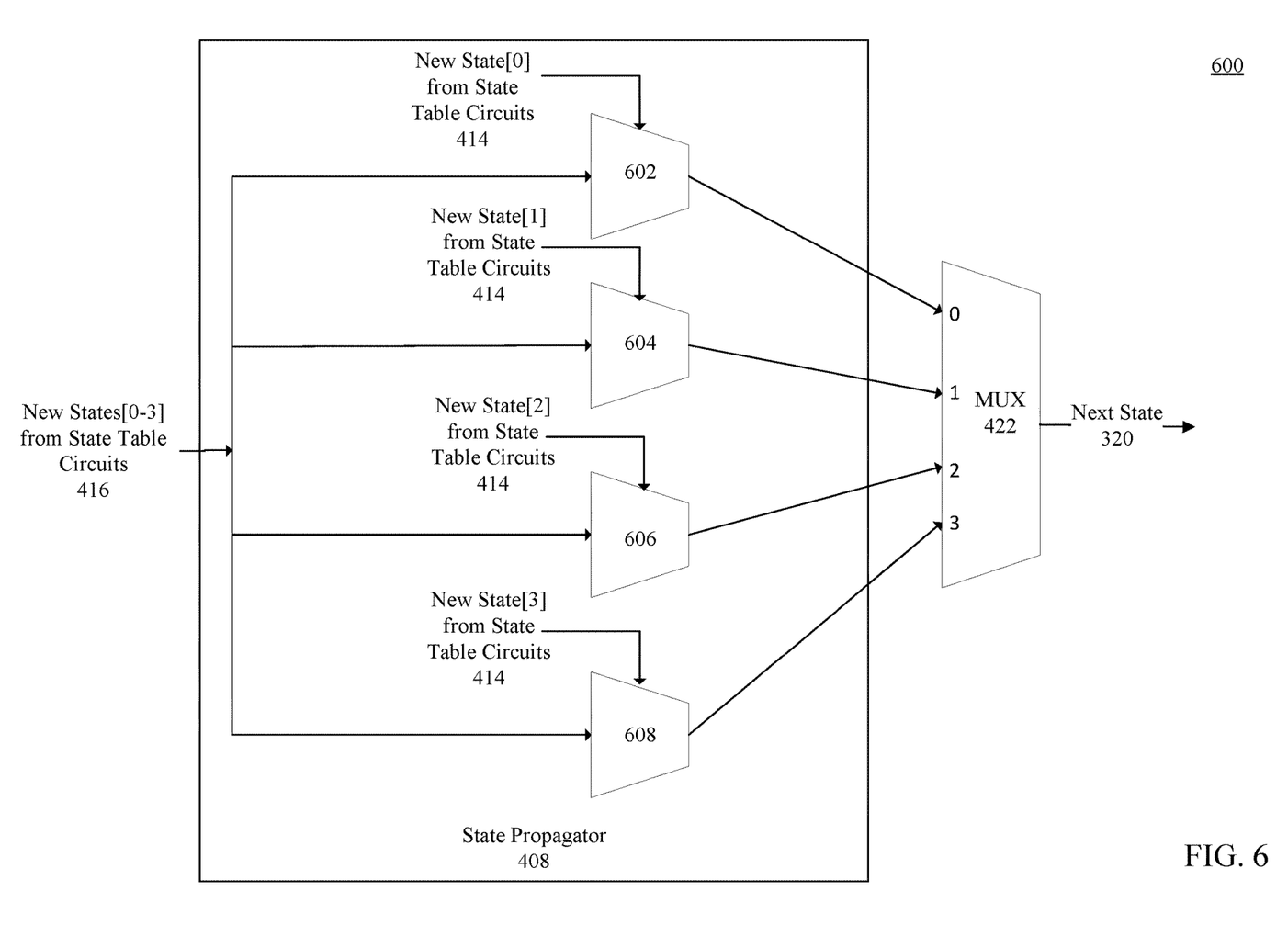
FIG. 6 depicts a block diagram of an example state propagator, according to an embodiment.

FIG. 6 depicts a block diagram of an example system 600 for state propagator 408, according to an embodiment. As shown in FIG. 6, system 600 includes state propagator 408 and MUX 422. Furthermore, state propagator 408 includes first-fourth MUXs 602-608, each of which receives the new states from state table circuits 416 as the input to be multiplexed. Each of MUXs 602-608 also receives one of the new states output from state table circuits 414 and is configured to switch the multiplexed input from state table circuits 416 to the MUX output. Such outputs are subsequently delivered to, for example, MUX 422 for final selection and output of next state 320 according to the current state as described herein above.

Although the figures and corresponding description herein above illustrates and describes embodiments in terms of state outputs, one of ordinary skill will appreciate that the principles are equally applicable to routing and selection of appropriate output values according to the state table circuits and state propagation logic. For instance, although state propagator 408 and MUX 422 are shown in FIG. 6 and described above, such illustration and description is applicable to other state propagators and MUXs disclosed herein.

Figure 7:
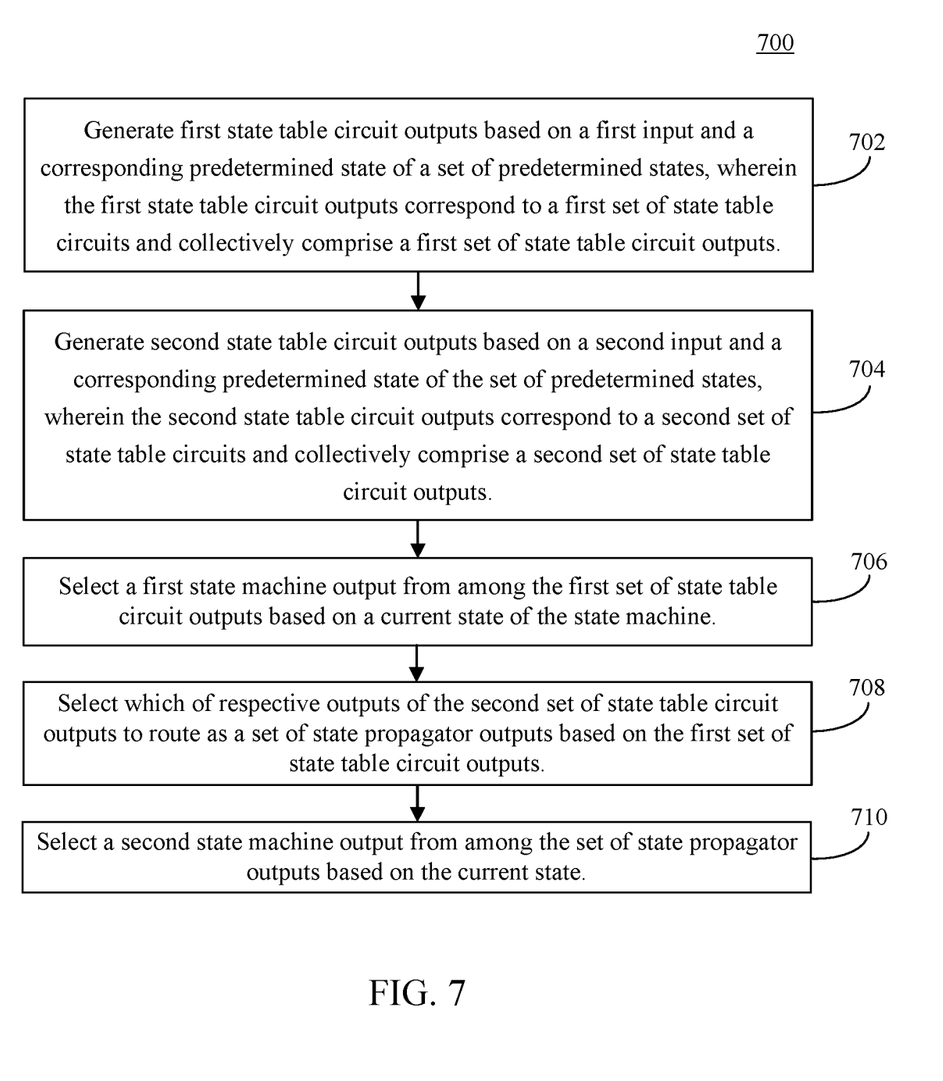
FIG. 7 depicts flowchart of a method for a state machine configured to process inputs in parallel, according to an embodiment.

In embodiments, state table circuit 202A-202N of FIG. 2 and state machine 400 of FIG. 4 may be used in various ways to process inputs in parallel. For instance, FIG. 7 depicts flowchart 700 of a method for a state machine to process inputs in parallel, according to an embodiment. Flowchart 700 is described with continued reference to FIGS. 2 and 4. However, other structural and operational embodiments will be apparent to persons skilled in the relevant art(s) based on the following discussion regarding flowchart 700.

Flowchart 700 begins at step 702. At step 702, first state table circuit outputs are generated based on a first input and a corresponding predetermined state of a set of predetermined states, wherein the first state table circuit outputs correspond to a first set of state table circuits and collectively comprise a first set of state table circuit outputs. For example, and with continued reference to state machine 400 of FIG. 4, state table circuits 414-420 each comprise a set of state tables wherein each state table corresponds to a state within which state machine 400 may be operating. For example, state table circuits 202A-202N of FIG. 2 correspond to states of 0-N (i.e., the predetermined states), respectively, for state machine 400. As described above, the output and next state of state machine 400 depends on the input and the current state of the state machine. By maintaining a lookup table for each of the N-possible states of state machine 400 (i.e., in the form of state table circuits 202A-202N, instances of which are incorporated into each of state table circuits 414-420), the table lookup is no longer dependent on the current state because all possible outputs and next state values are looked up simultaneously. The outputs of instances of state table circuits 202A-202N comprise the "first state table circuit outputs[.]" Although state machine 400 of FIG. 4 is depicted as generating states 402-406 and 434, and as described above, it should be understood that state table circuits 414-420 output not only the possible next states, by likewise the possible outputs for subsequent selection by, for example, MUX 420 of FIG. 4.

Flowchart 700 of FIG. 7 continues at step 704. In step 704, second state table circuit outputs are generated based on a second input and a corresponding predetermined state of the set of predetermined states, wherein the second state table circuit outputs correspond to a second set of state table circuits and collectively comprise a second set of state table circuit outputs. For example, and with continued reference to state machine 400 of FIG. 4, the second state table circuit outputs are, for example, those generated by any of state table circuits 416, 418 or 420. For example, suppose that the second input comprises input[1] 304. In such an instance, second state table circuit outputs are those outputs generated by state table circuits 416. Flowchart 700 of FIG. 7 continues at step 706.

In step 706, a first state machine output is selected from among the first set of state table circuit outputs based on a current state of the state machine. For example, and with continued reference to state machine 400 of FIG. 4, MUX 420 receives the possible next states and possible outputs from state table circuits 414, and selects the appropriate state and output based on current state 326, wherein the first state machine output corresponds to output[0] 310.

Flowchart 700 of FIG. 7 continues at step 708. In step 708, respective outputs of the second set of state table circuit outputs are selected to route as a set of state propagator outputs based on the first set of state table circuit outputs. For example, and with continued reference to state machine 400 of FIG. 4, state propagator 408 is configured to receive the outputs of state table circuits 416, and to select the appropriate set of state propagator outputs to route to MUX 422 based on states 402. For example, and with reference to FIG. 6, state propagator 408 may comprise MUXes 602-608 of FIG. 6, each MUX configured to receive a respective one of possible states/outputs from state table circuits 414, and thereafter use such to select the appropriate state of New States[0-3] from state table circuits 416 to route to MUX 422, all as depicted in FIG. 6. This operation of state propagator 408 serves to perform the state tracing operation described in greater detail herein above, thereby removing any dependence state machine 400 would otherwise have on the current state of state machine 400.

Flowchart 700 of FIG. 7 concludes at step 710. In step 710, a second state machine output is selected from among the set of state propagator outputs based on the current state. For example, and with continued reference to state machine 400 of FIG. 4, the outputs of state propagator 408 that were selected therein from among the outputs of state table circuits 416 are received by MUX 422, and thereafter the appropriate one of the respective outputs and new state corresponding to that input is selected by MUX 422 as dictated by the selection signal provided thereto (i.e., current state 326 of state machine 400 which comprises the fed-back new state 324 as output by MUX 426.

In the foregoing discussion of steps 702-710 of flowchart 700, it should be understood that at times, such steps may be performed in a different order or even contemporaneously with other steps. For example, the selection of steps 706 may be performed after the selections of steps 708 and/or 710, or may be performed at least partially in parallel. It should likewise be understood that although flowchart 700 describes a method of operating state machine 400 in a manner that processes only two inputs (i.e., the first and second inputs) in parallel, it may be appreciated that the method described in flowchart 700 of FIG. 7 may be extended to process any number of inputs. For example, and as shown in FIG. 4, state machine 400 may be configured to process 4 inputs (i.e., input[0]-input[3] 302-308 in parallel. Other operational embodiments will be apparent to persons skilled in the relevant art(s). Note also that the foregoing general description of the operation of state machine 400 is provided for illustration only, and embodiments of state machine 400 may comprise different hardware and/or software, and may operate in manners different than described above.

One may likewise appreciate that the maximum clock frequency is limited by how fast the MUXes may operate, which in turn is limited by the size of the MUX. As described herein above, the MUX size is dictated 1 for 1 by the number of states in the machine. However, embodiments herein may employ further optimization techniques to keep the size of the MUXes manageable for state machines with a large possible number of states. More specifically, embodiments may use sparsified state transition tables where the number of unique transitions for a given input is small. That is, embodiments may store state transitions in a sparse manner thereby limiting the size of MUX required.

Consider, for example, the following partial state transition table, Non-sparse State Transition Table D:

| Non-sparse State Transition Table D | | |
|---|---|---|
| Input | Current State | Next State |
| A | 0 | 0 |
|   | 1 | 0 |
|   | 2 | 0 |
|   | 3 | 1 |
| B | 0 | 1 |
|   | 1 | 1 |
|   | 2 | 2 |
|   | 3 | 1 |

In the case of Non-sparse State Transition Table D, while there are 4 possible current states, there are only two unique state transitions. We can simplify this table to a Sparse State Transition Table E:

| Sparse State Transition Table E | | |
|---|---|---|
| Input | Current State | Next State |
| A | 3 | 1 |
|   | Default | 0 |
| B | 2 | 2 |
|   | Default | 1 |

Sparse State Transition Table E shown above multiplexes between two possible next states for the shown inputs. In this example, the overall reduction is small compared to the original shown above. However, it should be understood that these tables are merely exemplary, and the reduction may be more significant for larger tables.

In this example, the output of a state table circuit such as, for example, state table circuits 414 as depicted in FIG. 4 is now pairs of (current state, next state). In order to multiplex among the next states, the actual current state has to be compared against these possible current states to determine which next state is to be used. If it matches none of the specified current states, then the default transition is used.

Where multiple inputs are being processed in parallel, such as with state machine 400 as depicted in FIG. 4, it is sometimes possible to further sparsify the number of valid state transitions because for certain inputs considered together, only certain states may be possible. For example, using the Non-sparse State Transition Table D shown above, consider an input of A followed by B. The input of A can only result in next states of 1 or 0. Thus, the next state for the input of B can only be 1.

In the above examples, we have assumed that all possible input states for an input are valid. However, this is not always the case. For some state machines, some input and current state combinations are not valid. For example, consider this new transition table, State Transition Table with Invalid Inputs E:

| State Transition Table with Invalid Inputs E | | |
|---|---|---|
| Input | Current State | Next State |
| A | 0 | Error |
|   | 1 | 0 |
|   | 2 | Error |
|   | 3 | 1 |
| B | 0 | Error |
|   | 1 | 1 |
|   | 2 | 2 |
|   | 3 | Error |

State Transition Table with Invalid Inputs E may be similarly sparsified yielding the following table, Sparsified State Transition Table with Invalid Inputs F:

| Sparsified State Transition Table with Invalid Inputs F | | |
|---|---|---|
| Input | Current State | Next State |
| A | 1 | 0 |
|   | 3 | 1 |
| B | 0 | 1 |
|   | 3 | 2 |

In the case of Sparsified State Transition Table with Invalid Inputs F, one may also use dynamic information to reduce the number of possible starting states to a sequence of inputs. Again considering inputs of A followed by B, the only possible starting states for an input of B are 0 and 3. If we look at the possible next states for A, the only valid one is 0 which corresponds to a current state of 1. In such a situation, the state transition for input A corresponding to state transition (3,1) may be eliminated from the state transition table.

At runtime, embodiments may use the above two techniques to reduce the number of sparse transitions. Further improvement is possible by profiling the state machine while operating a typical workload to determine the choice of hardware MUX size based on the average or typical number of transitions after sparsification. Optimizing MUX size in this manner permits further increase in the clock frequency due to reduced delay of the MUX. Of course, a slower fallback path will be needed to handle any situation where the number of transitions exceeds the optimized MUX size.

III. Example Computer System Implementation

Each of state table circuit 102, state table circuits 202A-202N, MUX 204, state table circuits 414-420, state propagators 408-412, MUXes 420-426 and/or MUXes 602-608, and flowchart 700 may be implemented in hardware, or hardware combined with software and/or firmware. For example, state table circuit 102, state table circuits 202A-202N, MUX 204, state table circuits 414-420, state propagators 408-412, MUXes 420-426 and/or MUXes 602-608, and flowchart 700 may be implemented as computer program code/instructions configured to be executed in one or more processors and stored in a computer readable storage medium. Alternatively, state table circuit 102, state table circuits 202A-202N, MUX 204, state table circuits 414-420, state propagators 408-412, MUXes 420-426 and/or MUXes 602-608, and flowchart 700 may be implemented as hardware logic/electrical circuitry.

For instance, in an embodiment, one or more, in any combination, of state table circuit 102, state table circuits 202A-202N, MUX 204, state table circuits 414-420, state propagators 408-412, MUXes 420-426 and/or MUXes 602-608, and flowchart 700 may be implemented together in a SoC. The SoC may include an integrated circuit chip that includes one or more of a processor (e.g., a central processing unit (CPU), microcontroller, microprocessor, digital signal processor (DSP), etc.), memory, one or more communication interfaces, and/or further circuits, and may optionally execute received program code and/or include embedded firmware to perform functions.

Figure 8:
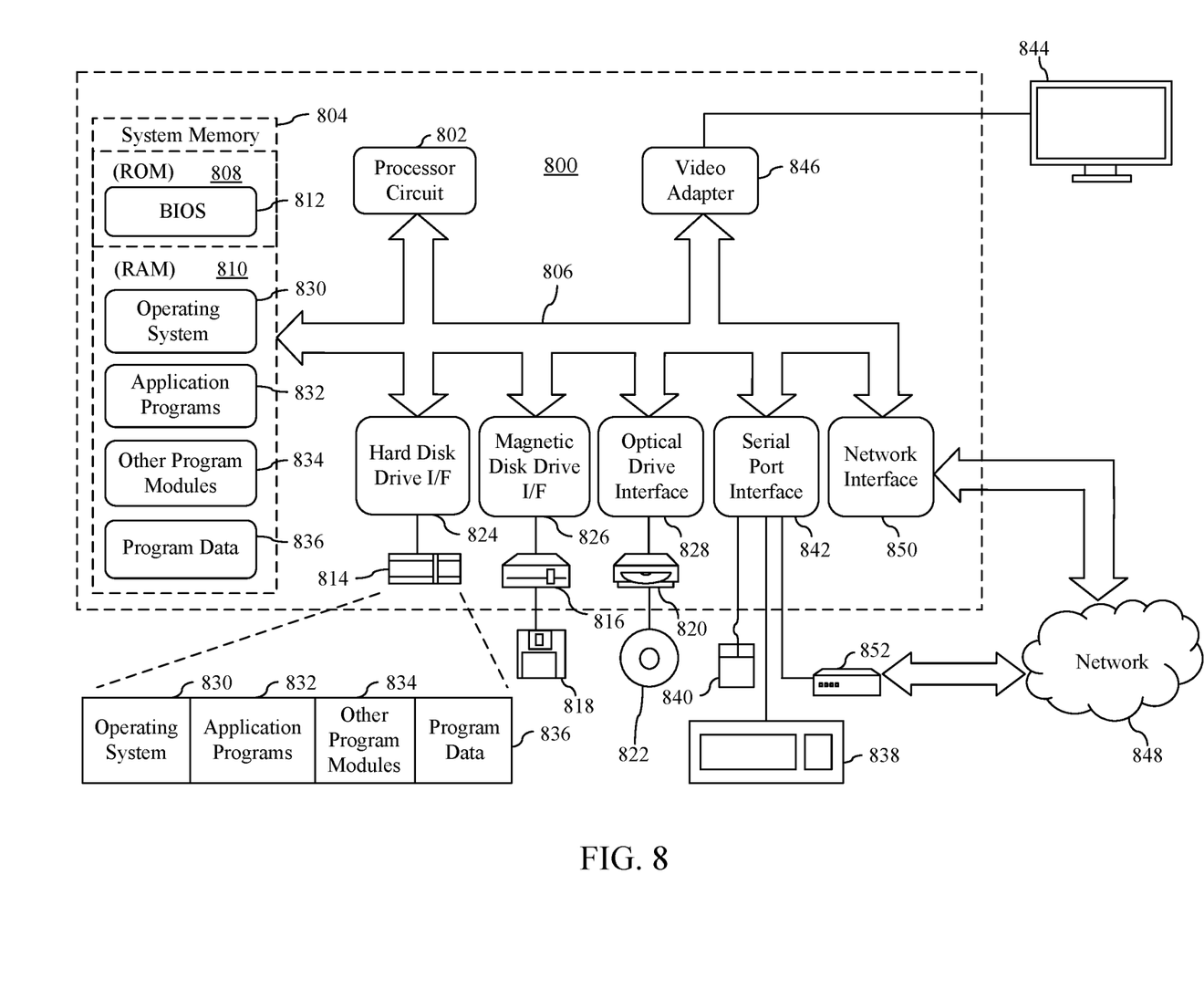
FIG. 8 is a block diagram of an example computer system in which embodiments may be implemented.

FIG. 8 depicts an exemplary implementation of a computing device 800 in which embodiments may be implemented. For example, in an embodiment, one or more, in any combination, of state table circuit 102, state table circuits 202A-202N, MUX 204, state table circuits 414-420, state propagators 408-412, MUXes 420-426 and/or MUXes 602-608, and flowchart 700 may be implemented in one or more computing devices similar to computing device 800 in stationary or mobile computer embodiments, including one or more features of computing device 800 and/or alternative features. The description of computing device 800 provided herein is provided for purposes of illustration and is not intended to be limiting. Embodiments may be implemented in further types of computer systems, as would be known to persons skilled in the relevant art(s).

As shown in FIG. 8, computing device 800 includes one or more processors, referred to as processor circuit 802, a system memory 804, and a bus 806 that couples various system components including system memory 804 to processor circuit 802. Processor circuit 802 is an electrical and/or optical circuit implemented in one or more physical hardware electrical circuit device elements and/or integrated circuit devices (semiconductor material chips or dies) as a central processing unit (CPU), a microcontroller, a microprocessor, and/or other physical hardware processor circuit. Processor circuit 802 may execute program code stored in a computer readable medium, such as program code of operating system 830, application programs 832, other programs 834, etc. Bus 806 represents one or more of any of several types of bus structures, including a memory bus or memory controller, a peripheral bus, an accelerated graphics port, and a processor or local bus using any of a variety of bus architectures. System memory 804 includes read only memory (ROM) 808 and random access memory (RAM) 810. A basic input/output system 812 (BIOS) is stored in ROM 808.

Computing device 800 also has one or more of the following drives: a hard disk drive 814 for reading from and writing to a hard disk, a magnetic disk drive 816 for reading from or writing to a removable magnetic disk 818, and an optical disk drive 820 for reading from or writing to a removable optical disk 822 such as a CD ROM, DVD ROM, or other optical media. Hard disk drive 814, magnetic disk drive 816, and optical disk drive 820 are connected to bus 806 by a hard disk drive interface 824, a magnetic disk drive interface 826, and an optical drive interface 828, respectively. The drives and their associated computer-readable media provide nonvolatile storage of computer-readable instructions, data structures, program modules and other data for the computer. Although a hard disk, a removable magnetic disk and a removable optical disk are described, other types of hardware-based computer-readable storage media can be used to store data, such as flash memory cards, digital video disks, RAMs, ROMs, and other hardware storage media.

A number of program modules may be stored on the hard disk, magnetic disk, optical disk, ROM, or RAM. These programs include operating system 830, one or more application programs 832, other programs 834, and program data 836. Application programs 832 or other programs 834 may include, for example, computer program logic (e.g., computer program code or instructions) for implementing of state table circuit 102, state table circuits 202A-202N, MUX 204, state table circuits 414-420, state propagators 408-412, MUXes 420-426 and/or MUXes 602-608, and flowchart 700 and/or further embodiments described herein.

A user may enter commands and information into the computing device 800 through input devices such as keyboard 838 and pointing device 840. Other input devices (not shown) may include a microphone, joystick, game pad, satellite dish, scanner, a touch screen and/or touch pad, a voice recognition system to receive voice input, a gesture recognition system to receive gesture input, or the like. These and other input devices are often connected to processor circuit 802 through a serial port interface 842 that is coupled to bus 806, but may be connected by other interfaces, such as a parallel port, game port, or a universal serial bus (USB).

A display screen 844 is also connected to bus 806 via an interface, such as a video adapter 846. Display screen 844 may be external to, or incorporated in computing device 800. Display screen 844 may display information, as well as being a user interface for receiving user commands and/or other information (e.g., by touch, finger gestures, virtual keyboard, etc.). In addition to display screen 844, computing device 800 may include other peripheral output devices (not shown) such as speakers and printers.

Computing device 800 is connected to a network 848 (e.g., the Internet) through an adaptor or network interface 850, a modem 852, or other means for establishing communications over the network. Modem 852, which may be internal or external, may be connected to bus 806 via serial port interface 842, as shown in FIG. 8, or may be connected to bus 806 using another interface type, including a parallel interface.

As used herein, the terms "computer program medium," "computer-readable medium," and "computer-readable storage medium" are used to refer to physical hardware media such as the hard disk associated with hard disk drive 814, removable magnetic disk 818, removable optical disk 822, other physical hardware media such as RAMs, ROMs, flash memory cards, digital video disks, zip disks, MEMs, nano-technology-based storage devices, and further types of physical/tangible hardware storage media. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media that are separate and non-overlapping with embodiments directed to computer-readable storage media.

As noted above, computer programs and modules (including application programs 832 and other programs 834) may be stored on the hard disk, magnetic disk, optical disk, ROM, RAM, or other hardware storage medium. Such computer programs may also be received via network interface 850, serial port interface 842, or any other interface type. Such computer programs, when executed or loaded by an application, enable computing device 800 to implement features of embodiments described herein. Accordingly, such computer programs represent controllers of the computing device 800.

Embodiments are also directed to computer program products comprising computer code or instructions stored on any computer-readable medium. Such computer program products include hard disk drives, optical disk drives, memory device packages, portable memory sticks, memory cards, and other types of physical storage hardware.

IV. Additional Example Embodiments

A state machine configured to process multiple inputs of a stream of inputs in parallel is provided herein. The state machine comprises: a first set of state table circuits, each state table circuit of the first set corresponding to a predetermined state of a set of predetermined states and configured to generate first state table circuit outputs based on a first input and the corresponding predetermined state, wherein the first state table circuit outputs corresponding to each state table circuit of the first set of state table circuits collectively comprise a first set of state table circuit outputs; a second set of state table circuits, each state table circuit of the second set corresponding to a predetermined state of the set of predetermined states and configured to generate second state table circuit outputs based on a second input and the corresponding predetermined state, wherein the second state table circuit outputs corresponding to each state table circuit of the second set of state table circuits comprise a second set of state table circuit outputs; a first output multiplexer (MUX) configured to receive the first set of state table circuit outputs and a current state of the state machine, and to select a first state machine output from among the first set of state table circuit outputs based on the current state; a state propagator configured to receive the first and second sets of state table circuit outputs and to select which of respective outputs of the second set of state table circuit outputs to route to respective outputs of the state propagator based on the first set of state table circuit outputs, said respective outputs comprising a set of state propagator outputs; and a second output MUX configured to receive the set of state propagator outputs and the current state of the state machine, and to select a second state machine output from among the set of state propagator outputs based on the current state.

In an embodiment of the foregoing state machine, each state table circuit output of the first and second sets of state table circuit outputs comprises an output value and a state value, and wherein the first and second state machine outputs comprise output values.

In an embodiment of the foregoing state machine, the state propagator is further configured to select which of respective ones of the second set of state table circuit outputs to route to respective outputs of the state propagator based on the state values corresponding to each state table circuit output of the first set of state table circuit outputs.

In an embodiment of the foregoing state machine, the first output MUX is further configured to select the first state table output from among the output values that correspond to each state table circuit output of the first set of state table circuit outputs.

In an embodiment of the foregoing state machine, the state machine further comprises: a state MUX configured to receive the current state of the state machine and the state values corresponding to the second set of state table circuit outputs, and to select a next state of the state machine.

In an embodiment of the foregoing state machine, the state machine further comprises: one or more additional input stages, each of the one or more additional input stages configured to receive one or more additional inputs, respectively, the one or more additional inputs being temporally between the first and second inputs, the one or more additional input stages including: an additional set of state table circuits, each state table circuit corresponding to a predetermined state of the set of predetermined states and is configured to generate a state table circuit output based on a respective one of the one or more additional inputs and the corresponding predetermined state, wherein the state table circuit outputs corresponding to each state table circuit of the additional set of state table circuits collectively comprise an additional set of state table circuit outputs; an additional state propagator configured to receive the additional set of state table circuit outputs and to route each of the outputs of the additional set of state table circuit outputs to respective outputs of the additional state propagator based on the state values corresponding to the state table circuit outputs received from a state table circuit that corresponds to a temporally next input of the stream of inputs; and an additional output MUX configured to receive the additional set of state table circuit outputs and the current state of the state machine, and to select an additional state table output from among the additional set of state table circuit outputs based on the current state of the state machine.

In an embodiment of the foregoing state machine, each additional set of state table circuits, additional state propagator and additional output mux corresponding to one of the one or more additional input stages is operated in a pipeline such that each of the first, second and additional state table output are valid on the same clock cycle.

A method for a state machine configured to process inputs in parallel is provided herein. The method comprising: generating first state table circuit outputs based on a first input and a corresponding predetermined state of a set of predetermined states, wherein the first state table circuit outputs correspond to a first set of state table circuits and collectively comprise a first set of state table circuit outputs; generating second state table circuit outputs based on a second input and a corresponding predetermined state of the set of predetermined states, wherein the second state table circuit outputs correspond to a second set of state table circuits and collectively comprise a second set of state table circuit outputs; selecting a first state machine output from among the first set of state table circuit outputs based on a current state of the state machine; selecting which of respective outputs of the second set of state table circuit outputs to route as a set of state propagator outputs based on the first set of state table circuit outputs; and selecting a second state machine output from among the set of state propagator outputs based on the current state.

In an embodiment of the foregoing method, each state table circuit output of the first and second sets of state table circuit outputs comprises an output value and a state value, and wherein the first and second state machine outputs comprise output values.

In an embodiment of the foregoing method, selecting the respective outputs of the second set of state table circuit outputs further comprises selecting the respective ones of the second set of state table circuit outputs to route to respective outputs of the state propagator based on the state values corresponding to each state table circuit output of the first set of state table circuit outputs.

In an embodiment of the foregoing method, selecting the first state machine output further comprises selecting an output value from among the output values that correspond to each state table circuit output of the first set of state table circuit outputs.

In an embodiment of the foregoing method, the method further comprises selecting a next state of the state machine from among the state values corresponding to the second set of state table circuit outputs based on the current state of the state machine.

In an embodiment of the foregoing method, the method further comprises: generating one or more additional state machine outputs, each of the one or more additional state machine outputs corresponding to a respective of one or more additional inputs, the one or more additional inputs being temporally between the first and second inputs, said generating comprising for each of the one or more additional inputs: generating an additional set of state table circuit outputs based on the respective one of the one or more additional inputs and a corresponding predetermined state of a set of predetermined states; selecting which of respective outputs of the additional set of state table circuit outputs to route as an additional set of state propagator outputs based on the values of a set of state table circuit outputs that correspond to a temporally next input of the stream of inputs; and selecting the respective one of the one or more additional state machine outputs from among the additional set of state propagator outputs based on the current state.

In an embodiment of the foregoing method, the method further comprises operating the state machine by pipelining the steps of generating an additional set of state table circuit outputs, selecting which of respective outputs of the additional set of state table circuit outputs and selecting the respective one of the one or more additional state machine outputs.

A computer program product comprising a computer-readable memory device having computer program logic recorded thereon that when executed by at least one processor of a computing device causes the at least one processor to perform operations implementing a state machine configured to process inputs in parallel is provided herein. The operations comprise: generating first state table circuit outputs based on a first input and a corresponding predetermined state of a set of predetermined states, wherein the first state table circuit outputs correspond to a first set of state table circuits and collectively comprise a first set of state table circuit outputs; generating second state table circuit outputs based on a second input and a corresponding predetermined state of the set of predetermined states, wherein the second state table circuit outputs correspond to a second set of state table circuits and collectively comprise a second set of state table circuit outputs; selecting a first state machine output from among the first set of state table circuit outputs based on a current state of the state machine; selecting which of respective outputs of the second set of state table circuit outputs to route as a set of state propagator outputs based on the values of the first set of state table circuit outputs; and selecting a second state machine output from among the set of state propagator outputs based on the current state.

In an embodiment of the foregoing computer program product, each state table circuit output of the first and second sets of state table circuit outputs comprises an output value and a state value, and wherein the first and second state machine outputs comprise output values.

In an embodiment of the foregoing computer program product, selecting the first state machine output comprises selecting an output value from among the output values that correspond to each state table circuit output of the first set of state table circuit outputs.

In an embodiment of the foregoing computer program product, the operations further comprise selecting a next state of the state machine from among the state values corresponding to the second set of state table circuit outputs based on the current state of the state machine.

In an embodiment of the foregoing computer program product, the operations further comprise: generating one or more additional state machine outputs, each of the one or more additional state machine outputs corresponding to a respective of one or more additional inputs, the one or more additional inputs being temporally between the first and second inputs, said generating comprising for each of the one or more additional inputs: generating an additional set of state table circuit outputs based on the respective one of the one or more additional inputs and a corresponding predetermined state of a set of predetermined states; selecting which of respective outputs of the additional set of state table circuit outputs to route as an additional set of state propagator outputs based on the values of a set of state table circuit outputs that correspond to a temporally next input of the stream of inputs; and selecting the respective one of the one or more additional state machine outputs from among the additional set of state propagator outputs based on the current state.

In an embodiment of the foregoing computer program product, the operations further comprise pipelining the steps of generating an additional set of state table circuit outputs, selecting which of respective outputs of the additional set of state table circuit outputs and selecting the respective one of the one or more additional state machine outputs.

V. Conclusion

While various embodiments of the disclosed subject matter have been described above, it should be understood that they have been presented by way of example only, and not limitation. It will be understood by those skilled in the relevant art(s) that various changes in form and details may be made therein without departing from the spirit and scope of the embodiments as defined in the appended claims. Accordingly, the breadth and scope of the disclosed subject matter should not be limited by any of the above-described exemplary embodiments, but should be defined only in accordance with the following claims and their equivalents.

What is claimed is:

1. A state machine configured to process multiple inputs of a stream of inputs in parallel, comprising:

a first set of state table circuits, each state table circuit of the first set corresponding to a predetermined state of a set of predetermined states and configured to generate first state table circuit outputs based on a first input and the corresponding predetermined state, wherein the first state table circuit outputs corresponding to each state table circuit of the first set of state table circuits collectively comprise a first set of state table circuit outputs;

a second set of state table circuits, each state table circuit of the second set corresponding to a predetermined state of the set of predetermined states and configured to generate second state table circuit outputs based on a second input and the corresponding predetermined state, wherein the second state table circuit outputs corresponding to each state table circuit of the second set of state table circuits comprise a second set of state table circuit outputs;

a first output multiplexer (MUX) configured to receive the first set of state table circuit outputs and a current state of the state machine, and to select a first state machine output from among the first set of state table circuit outputs based on the current state;

a state propagator configured to receive the first and second sets of state table circuit outputs and to select which of respective outputs of the second set of state table circuit outputs to route to respective outputs of the state propagator based on the first set of state table circuit outputs, said respective outputs comprising a set of state propagator outputs; and a second output MUX configured to receive the set of state propagator outputs and the current state of the state machine, and to select a second state machine output from among the set of state propagator outputs based on the current state.

2. The state machine of claim 1, wherein each state table circuit output of the first and second sets of state table circuit outputs comprises an output value and a state value, and wherein the first and second state machine outputs comprise output values.

3. The state machine of claim 2, wherein the state propagator is further configured to select which of respective ones of the second set of state table circuit outputs to route to respective outputs of the state propagator based on the state values corresponding to each state table circuit output of the first set of state table circuit outputs.

4. The state machine of claim 2, wherein the first output MUX is further configured to select the first state table output from among the output values that correspond to each state table circuit output of the first set of state table circuit outputs.

5. The state machine of claim 2, further comprising:
a state MUX configured to receive the current state of the state machine and the state values corresponding to the second set of state table circuit outputs, and to select a next state of the state machine.

6. The state machine of claim 2, further comprising one or more additional input stages, each of the one or more additional input stages configured to receive one or more additional inputs, respectively, the one or more additional inputs being temporally between the first and second inputs, the one or more additional input stages including:
an additional set of state table circuits, each state table circuit corresponding to a predetermined state of the set of predetermined states and is configured to generate a state table circuit output based on a respective one of the one or more additional inputs and the corresponding predetermined state, wherein the state table circuit outputs corresponding to each state table circuit of the additional set of state table circuits collectively comprise an additional set of state table circuit outputs;

an additional state propagator configured to receive the additional set of state table circuit outputs and to route each of the outputs of the additional set of state table circuit outputs to respective outputs of the additional state propagator based on the state values corresponding to the state table circuit outputs received from a state table circuit that corresponds to a temporally next input of the stream of inputs; and an additional output MUX configured to receive the additional set of state table circuit outputs and the current state of the state machine, and to select an additional state table output from among the additional set of state table circuit outputs based on the current state of the state machine.

7. The state machine of claim 6, wherein each additional set of state table circuits, additional state propagator and additional output mux corresponding to one of the one or more additional input stages is operated in a pipeline such that each of the first, second and additional state table output are valid on the same clock cycle.

8. A method for a state machine configured to process inputs in parallel, comprising:
generating first state table circuit outputs based on a first input and a corresponding predetermined state of a set of predetermined states, wherein the first state table circuit outputs correspond to a first set of state table circuits and collectively comprise a first set of state table circuit outputs;

generating second state table circuit outputs based on a second input and a corresponding predetermined state of the set of predetermined states, wherein the second state table circuit outputs correspond to a second set of state table circuits and collectively comprise a second set of state table circuit outputs;

selecting a first state machine output from among the first set of state table circuit outputs based on a current state of the state machine;

selecting which of respective outputs of the second set of state table circuit outputs to route as a set of state propagator outputs based on the first set of state table circuit outputs; and selecting a second state machine output from among the set of state propagator outputs based on the current state.

9. The method of claim 8, wherein each state table circuit output of the first and second sets of state table circuit outputs comprises an output value and a state value, and wherein the first and second state machine outputs comprise output values.

10. The method of claim 9, wherein selecting the respective outputs of the second set of state table circuit outputs further comprises selecting the respective ones of the second set of state table circuit outputs to route to respective outputs of the state propagator based on the state values corresponding to each state table circuit output of the first set of state table circuit outputs.

11. The method of claim 9, wherein selecting the first state machine output further comprises selecting an output value from among the output values that correspond to each state table circuit output of the first set of state table circuit outputs.

12. The method of claim 9, further comprising selecting a next state of the state machine from among the state values corresponding to the second set of state table circuit outputs based on the current state of the state machine.

13. The method of claim 9, further comprising:
generating one or more additional state machine outputs, each of the one or more additional state machine outputs corresponding to a respective of one or more additional inputs, the one or more additional inputs being temporally between the first and second inputs, said generating comprising for each of the one or more additional inputs:
generating an additional set of state table circuit outputs based on the respective one of the one or more additional inputs and a corresponding predetermined state of a set of predetermined states;
selecting which of respective outputs of the additional set of state table circuit outputs to route as an additional set of state propagator outputs based on the values of a set of state table circuit outputs that correspond to a temporally next input of the stream of inputs; and
selecting the respective one of the one or more additional state machine outputs from among the additional set of state propagator outputs based on the current state.

14. The method of claim 13 further comprising operating the state machine by pipelining the steps of generating an additional set of state table circuit outputs, selecting which of respective outputs of the additional set of state table circuit outputs and selecting the respective one of the one or more additional state machine outputs.

15. A computer program product comprising a computer-readable storage medium having computer program logic recorded thereon that when executed by at least one processor of a computing device causes the at least one processor to perform operations implementing a state machine configured to process inputs in parallel, the operations comprising:
generating first state table circuit outputs based on a first input and a corresponding predetermined state of a set of predetermined states, wherein the first state table circuit outputs correspond to a first set of state table circuits and collectively comprise a first set of state table circuit outputs;
generating second state table circuit outputs based on a second input and a corresponding predetermined state of the set of predetermined states, wherein the second state table circuit outputs correspond to a second set of state table circuits and collectively comprise a second set of state table circuit outputs;
selecting a first state machine output from among the first set of state table circuit outputs based on a current state of the state machine;
selecting which of respective outputs of the second set of state table circuit outputs to route as a set of state propagator outputs based on the values of the first set of state table circuit outputs; and
selecting a second state machine output from among the set of state propagator outputs based on the current state.

16. The computer program product of claim 15, wherein each state table circuit output of the first and second sets of state table circuit outputs comprises an output value and a state value, and wherein the first and second state machine outputs comprise output values.

17. The computer program product of claim 16, wherein selecting the first state machine output comprises selecting an output value from among the output values that correspond to each state table circuit output of the first set of state table circuit outputs.

18. The computer program product of claim 16, wherein the operations further comprise selecting a next state of the state machine from among the state values corresponding to the second set of state table circuit outputs based on the current state of the state machine.

19. The computer program product of claim 16, wherein the operations further comprise:
generating one or more additional state machine outputs, each of the one or more additional state machine outputs corresponding to a respective of one or more additional inputs, the one or more additional inputs being temporally between the first and second inputs, said generating comprising for each of the one or more additional inputs:
generating an additional set of state table circuit outputs based on the respective one of the one or more additional inputs and a corresponding predetermined state of a set of predetermined states;
selecting which of respective outputs of the additional set of state table circuit outputs to route as an additional set of state propagator outputs based on the values of a set of state table circuit outputs that correspond to a temporally next input of the stream of inputs; and
selecting the respective one of the one or more additional state machine outputs from among the additional set of state propagator outputs based on the current state.

20. The computer program product of claim 19 wherein the operations further comprise pipelining the steps of generating an additional set of state table circuit outputs, selecting which of respective outputs of the additional set of state table circuit outputs and selecting the respective one of the one or more additional state machine outputs.

* * * * *